(12) United States Patent
Xie et al.

(10) Patent No.: US 11,251,287 B2
(45) Date of Patent: Feb. 15, 2022

(54) SELF-ALIGNED UNIFORM BOTTOM SPACERS FOR VTFETS

(71) Applicant: INTERNATIONAL BUSINESS MACHINES CORPORATION, Armonk, NY (US)

(72) Inventors: Ruilong Xie, Niskayuna, NY (US); Hemanth Jagannathan, Niskayuna, NY (US); Jay William Strane, Warwick, NY (US); Eric Miller, Watervliet, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/847,938

(22) Filed: Apr. 14, 2020

(65) Prior Publication Data
US 2021/0320186 A1    Oct. 14, 2021

(51) Int. Cl.
*H01L 29/66*  (2006.01)
*H01L 29/78*  (2006.01)
*H01L 21/8234*  (2006.01)

(52) U.S. Cl.
CPC .. *H01L 29/6656* (2013.01); *H01L 21/823431* (2013.01); *H01L 21/823468* (2013.01); *H01L 29/785* (2013.01)

(58) Field of Classification Search
CPC ......... H01L 29/6656; H01L 21/823431; H01L 21/823468; H01L 29/66795–66818; H01L 27/0886; H01L 27/0924; H01L 21/823821; H01L 21/845; H01L 27/10879; H01L 27/1211; H01L 29/41791; H01L 29/785–7856; H01L 2924/13067
See application file for complete search history.

(56) References Cited

U.S. PATENT DOCUMENTS

| | | |
|---|---|---|
| 9,437,503 B1 | 9/2016 | Mallela et al. |
| 9,530,863 B1 | 12/2016 | Zhang et al. |
| 9,530,866 B1 | 12/2016 | Zhang et al. |
| 9,570,357 B2 | 2/2017 | Anderson et al. |
| 9,627,511 B1 | 4/2017 | Cheng et al. |
| 9,716,170 B1 | 7/2017 | Cheng et al. |
| 9,741,626 B1 | 8/2017 | Cheng et al. |
| 9,780,208 B1 | 10/2017 | Xie et al. |
| 9,799,749 B1 | 10/2017 | Bi et al. |
| 10,096,692 B1 | 10/2018 | Cheng et al. |
| 10,263,122 B1 | 4/2019 | Zang et al. |
| 2017/0358497 A1 | 12/2017 | Cheng et al. |
| 2017/0365713 A1* | 12/2017 | Cheng ................ H01L 21/2236 |
| 2019/0051563 A1 | 2/2019 | Park et al. |
| 2019/0097016 A1 | 3/2019 | Alptekin et al. |

* cited by examiner

*Primary Examiner* — Cuong B Nguyen
(74) *Attorney, Agent, or Firm* — Tutunjian & Bitetto, P.C.; Abdy Raissinia (57) ABSTRACT

Semiconductor devices and methods of forming the same include forming a bottom source/drain structure around a fin. A multi-layer bottom spacer is formed on the bottom source/drain structure, around the fin. Each layer of the multi-layer bottom spacer has a respective vertical height above the bottom source/drain structure, with a layer of the multi-layer bottom spacer that is farthest from the fin having a greater vertical height than a layer that is closest to the fin, to address parasitic capacitance from the bottom source/drain structure.

18 Claims, 9 Drawing Sheets

SELF-ALIGNED UNIFORM BOTTOM SPACERS FOR VTFETS

BACKGROUND

The present invention generally relates to semiconductor device fabrication, and, more particularly, to the fabrication of vertical transfer field effect transistors (VTFETs) that include three-layer uniform bottom spacers that are self-aligned to a shallow trench isolation structure.

Bottom spacers in VTFETs insulate the gate conductor from the bottom source/drain structures. However, existing processes for VTFET fabrication provide bottom spacers that suffer from defects and large feature-to-feature variations. This decreases device yield and diminishes the performance of the finished device.

SUMMARY

A method of forming a semiconductor device includes forming a bottom source/drain structure around a fin. A multi-layer bottom spacer is formed on the bottom source/drain structure, around the fin. Each layer of the multi-layer bottom spacer has a respective vertical height above the bottom source/drain structure, with a layer of the multi-layer bottom spacer that is farthest from the fin having a greater vertical height than a layer that is closest to the fin, to address parasitic capacitance from the bottom source/drain structure.

A method of forming a semiconductor device includes forming a semiconductor fin. A liner is formed on sidewalls of the fin. A bottom source/drain structure is formed around the fin. An additional semiconductor layer is formed on the bottom source/drain structure. A sacrificial semiconductor layer is grown on the additional semiconductor layer. A sacrificial spacer is formed on the liner, after forming the sacrificial semiconductor layer. The sacrificial semiconductor layer is etched away after forming the sacrificial spacer, to expose a portion of the liner. A middle layer of a three-layer bottom spacer is formed in a gap between the sacrificial spacer and the additional semiconductor layer. A portion of the liner is etched away above the height of the middle layer of the three-layer bottom spacer to form an inner layer of the three-layer bottom spacer. A trench is formed that penetrates the bottom source/drain structure. An outer layer of the three-layer bottom spacer is formed in the trench. The outer layer has a greater height than the inner layer and the middle layer.

A semiconductor device includes a fin and a bottom source/drain structure around the fin. A multi-layer bottom spacer is on the bottom source/drain structure, around the fin. Each layer of the multi-layer bottom spacer has a respective vertical height above the bottom source/drain structure, with a layer of the multi-layer bottom spacer that is farthest from the fin having a greater vertical height than a layer of the multi-layer bottom spacer that is closest to the fin, to address parasitic capacitance from the bottom source/drain structure.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The present embodiments provide vertical transfer field effect transistors (VTFETs), having superior uniformity in their bottom spacers. By using a self-aligned, multi-layer process to form the bottom spacers, the parasitic capacitance can furthermore be decreased with the increased height of an outer portion of the bottom spacer. Because the bottom spacer has a lower height in the layers that are close to the fin, the gate length can be maintained, while the taller portions reduce capacitance.

Figure 1:
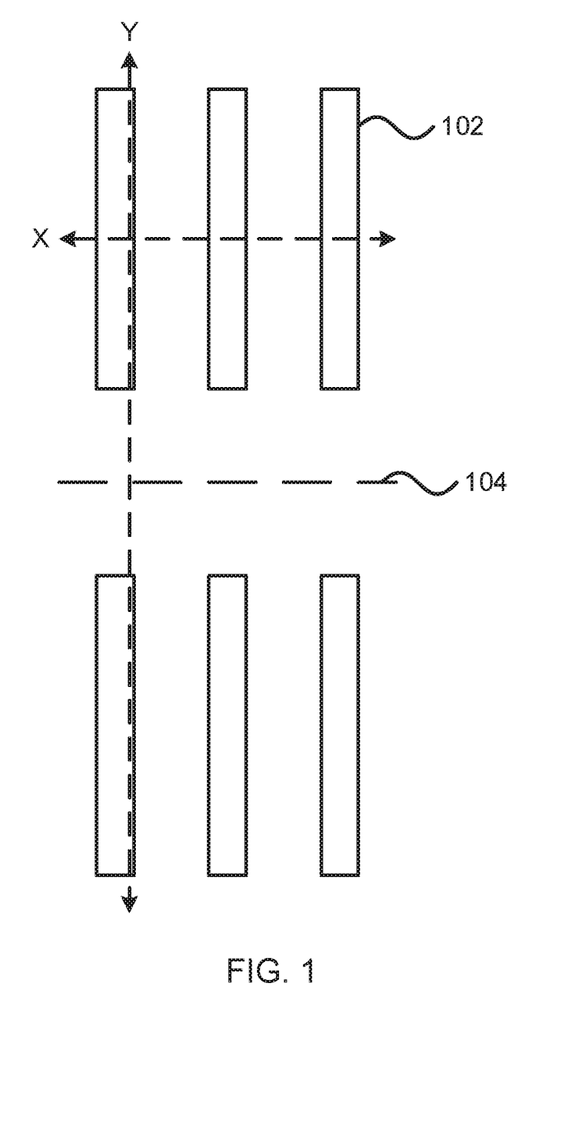
FIG. 1 is a top-down view of a set of fins, arranged on a substrate, and two distinct cross-sectional planes that illustrate different views in the succeeding drawings, in accordance with an embodiment of the present invention.

Referring now to the drawings in which like numerals represent the same or similar elements and initially to FIG. 1, a top-down view of a set of fins 102 is shown. This view establishes two different cross-sectional planes: X indicates a cross-sectional view that cuts transversely across multiple fins 102 in a single cell, while Y indicates a cross-sectional view that cuts parallel to the fins 102, across a cell boundary 104, along the edge of the fins 102. The following figures will show both views, side by side, to illustrate a step-by-step process for forming VTFETs according to the present embodiments. It should be understood that the present figures are not drawn to a realistic scale, nor are they intended to represent a consistent scale between the figures. Thus, features shown with particular relative proportions in one figure may be shown with different proportions in another figure.

Figure 2:
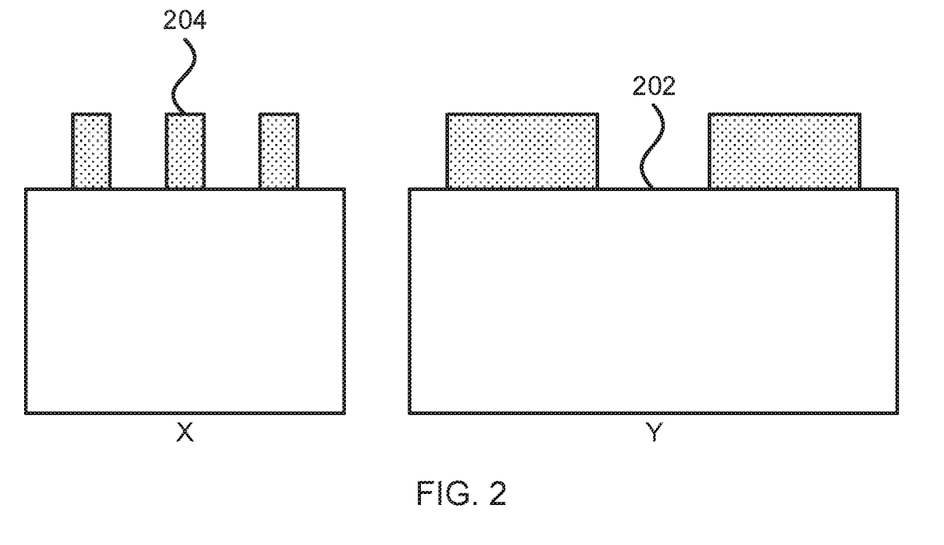
FIG. 2 is a set of cross-sectional views of a set of fins, including a plane that is perpendicular to the fins and a plane that is parallel to the fins, showing the formation of fin hardmasks on a semiconductor substrate, in accordance with an embodiment of the present invention.

Referring now to FIG. 2, cross-sectional views of a step in the fabrication of VTFETs with uniform multi-layer bottom spacers is shown. A hardmask pattern 204 is formed on a semiconductor substrate 202. The hardmask pattern 204 can be formed from any appropriate hardmask material, such as silicon nitride, and can be patterned by any appropriate process, such as photolithographic patterning. The hardmask pattern 204 establishes locations on the semiconductor substrate 202 where semiconductor fins will be formed.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

Figure 3:
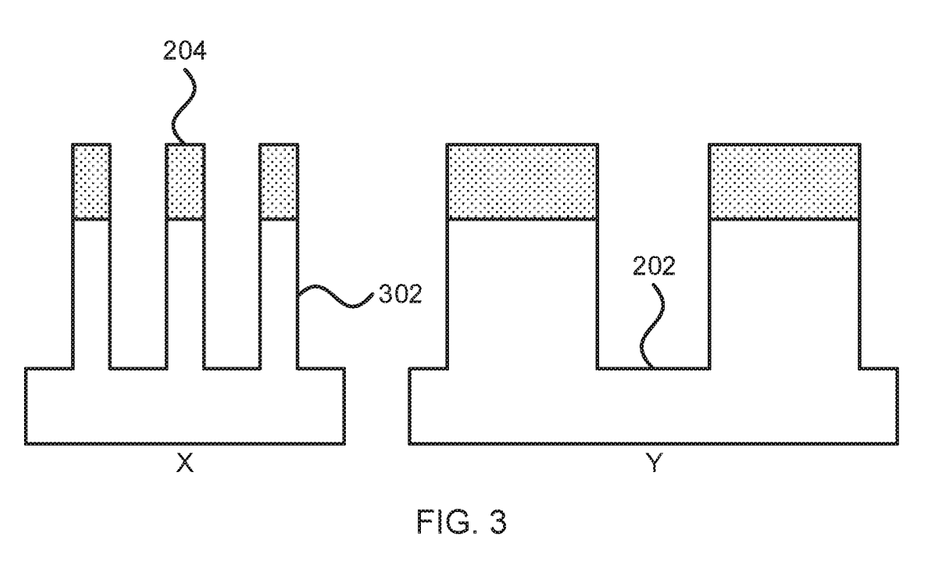
FIG. 3 is a set of cross-sectional views of a set of fins, including a plane that is perpendicular to the fins and a plane that is parallel to the fins, formation of fins in the semiconductor substrate by an etch around the fin hardmasks, in accordance with an embodiment of the present invention.

Referring now to FIG. 3, cross-sectional views of a step in the fabrication of VTFETs with uniform multi-layer bottom spacers is shown. The semiconductor substrate 202 is anisotropically etched, for example using reactive ion etching (RIE) around the hardmask pattern 204, thereby forming fins 302. It should be understood that, in some alternative embodiments, the fins 302 can be formed from a material that is distinct from the material of the semiconductor substrate 202, for example by etching down into a separate semiconductor layer (not shown) formed between the hardmask pattern 204 and the semiconductor substrate 202. The height of the fins 302 can be controlled by timing the anisotropic etch to determine the depth of the etch.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the fins 302 can be formed by spacer imaging transfer.

Figure 4:
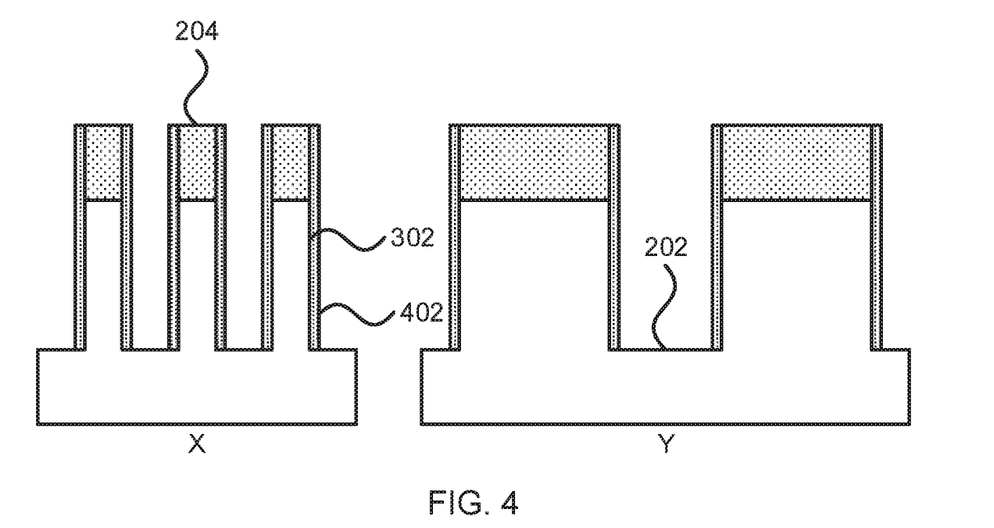
FIG. 4 is a set of cross-sectional views of a set of fins, including a plane that is perpendicular to the fins and a plane that is parallel to the fins, the formation of a liner layer on sidewalls of the fins, in accordance with an embodiment of the present invention.

Referring now to FIG. 4, cross-sectional views of a step in the fabrication of VTFETs with uniform multi-layer bottom spacers is shown. A liner 402 is formed on sidewalls of the fins 302 and the hardmask pattern 204. In some embodiments, the liner 402 can be formed by the formation of an electrically insulating material, such as silicon dioxide, on sidewalls of the fins 302 and the surface of the semiconductor substrate 202. The insulating material can then be removed from horizontal surfaces using, for example, a selective anisotropic etch, leaving the liner 402 on the vertical surfaces. In other embodiments, the liner 402 can be formed by an oxidation process that oxidizes the outer surface of the fins 302. It is specifically contemplated that the liner 402 may be quite thin, for example between about 1 nm and about 10 nm.

As used herein, the term "selective" in reference to a material removal process denotes that the rate of material removal for a first material is greater than the rate of removal for at least another material of the structure to which the material removal process is being applied. Thus, the removal of the insulating material from the horizontal surfaces does not harm the underlying semiconductor substrate 202.

Figure 5:
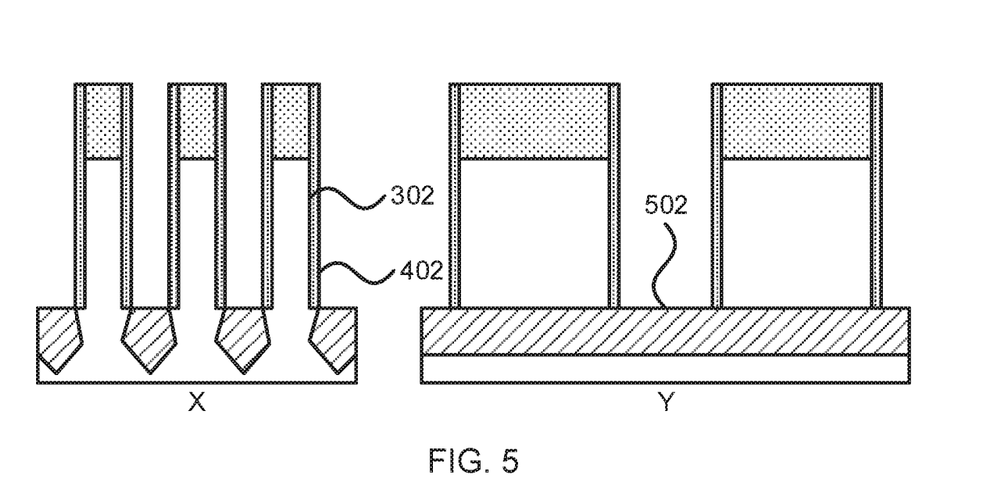
FIG. 5 is a set of cross-sectional views of a set of fins, including a plane that is perpendicular to the fins and a plane that is parallel to the fins, the formation of bottom source/drain structures in the semiconductor substrate, in accordance with an embodiment of the present invention.

Referring now to FIG. 5, cross-sectional views of a step in the fabrication of VTFETs with uniform multi-layer bottom spacers is shown. Bottom source/drain regions 502 are formed in the semiconductor substrate 202 by, e.g., dopant implantation. The dopant may include one or more dopant species of any conductivity type. As used herein, the term "conductivity type" denotes a dopant region being p-type or n-type. The selection of the dopant will depend on the designed properties of the VTFET device. As shown, the dopant will partially infiltrate the material underneath the fins 302. It should be understood that cross-section Y is shown along the edge of the fins 302, to illustrate the presence of the dopant underneath the fins 302.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous. The dopants may be implanted into the semiconductor substrate 202 by an ion implantation process, whereby dopant ions are accelerated in an electric field and embed themselves into the semiconductor substrate 202 upon impact.

Figure 6:
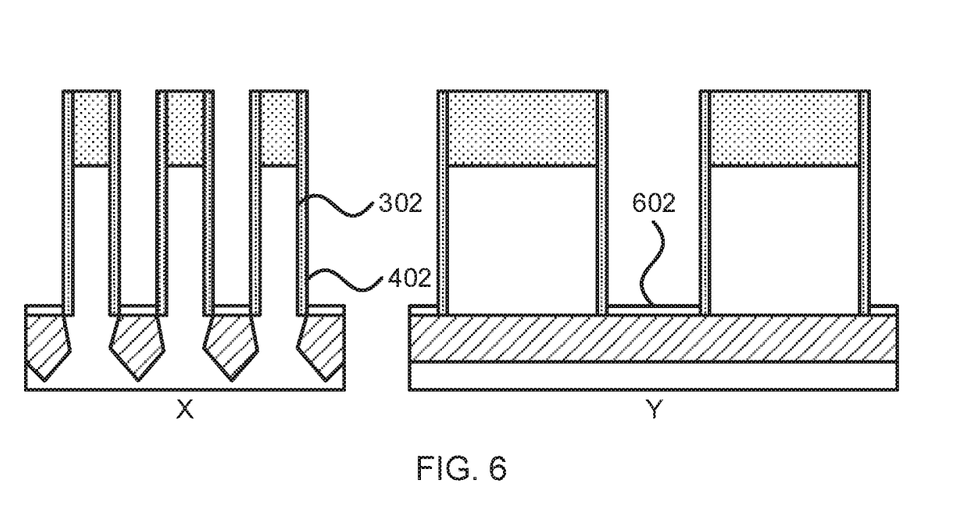
FIG. 6 is a set of cross-sectional views of a set of fins, including a plane that is perpendicular to the fins and a plane that is parallel to the fins, formation of an additional semiconductor layer over the bottom source/drain structures, in accordance with an embodiment of the present invention.

Referring now to FIG. 6, cross-sectional views of a step in the fabrication of VTFETs with uniform multi-layer bottom spacers is shown. A thin first layer of epitaxial semiconductor material 602 is grown on the exposed surfaces of the bottom source/drain regions 502. It is specifically contemplated that the epitaxial semiconductor material can be the same as the material of the semiconductor substrate, but it should be understood that any crystallographically compatible semiconductor material can be used instead. The thickness of the epitaxial semiconductor material 602 can be precisely controlled and, in some embodiments, the first layer of epitaxial material 602 can be about 2 nm thick, but it should be understood that other thicknesses can be used instead, such as a thickness less than about 5 nm.

The term "epitaxial growth," as used herein, refers to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Figure 7:
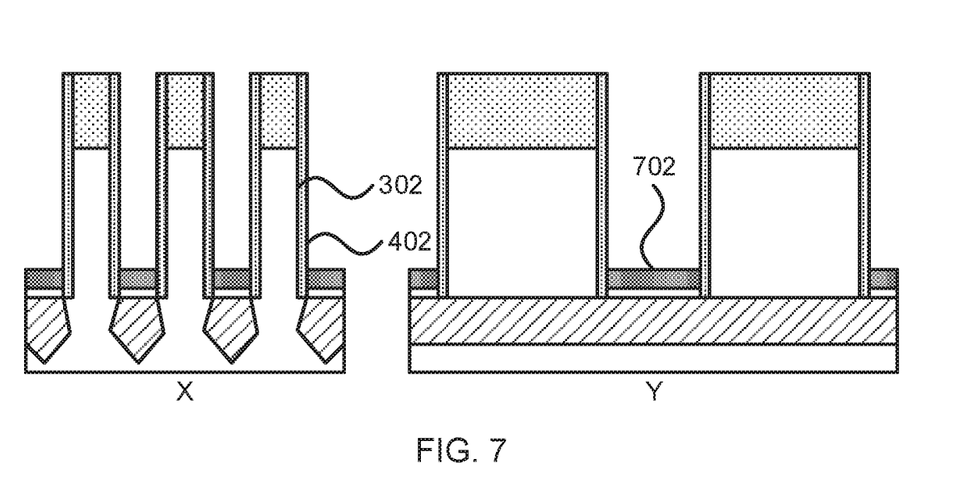
FIG. 7 is a set of cross-sectional views of a set of fins, including a plane that is perpendicular to the fins and a plane that is parallel to the fins, showing the formation of a sacrificial semiconductor layer on the additional semiconductor layer, in accordance with an embodiment of the present invention.

Referring now to FIG. 7, cross-sectional views of a step in the fabrication of VTFETs with uniform multi-layer bottom spacers is shown. A sacrificial second epitaxial semiconductor layer 702 is formed on the first epitaxial semiconductor layer 602. It is specifically contemplated that the sacrificial second epitaxial semiconductor layer 702 may be formed from a distinct semiconductor material that is selectively etchable relative to the material of the first epitaxial semiconductor layer 602. For example, in an embodiment that uses silicon as the material of the first epitaxial semiconductor layer 602, the sacrificial second epitaxial semiconductor layer 702 may be formed from silicon germanium.

Figure 8:
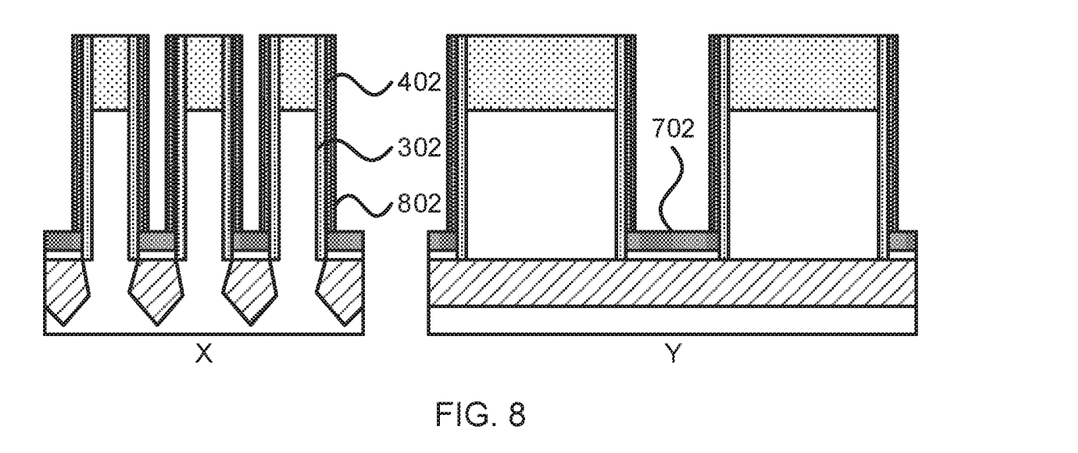
FIG. 8 is a set of cross-sectional views of a set of fins, including a plane that is perpendicular to the fins and a plane that is parallel to the fins, showing the formation of a sacrificial liner on the sidewalls of the fins, in accordance with an embodiment of the present invention.

Referring now to FIG. 8, cross-sectional views of a step in the fabrication of VTFETs with uniform multi-layer bottom spacers is shown. A sacrificial spacer 802 is formed over the vertical sidewalls of the fins 302 and the liner 402. The sacrificial spacer 802 can be formed from any appropriate material, such as, e.g., titanium oxide, aluminum oxide, or amorphous silicon. In some embodiments, the sacrificial spacer 802 can be formed by conformally depositing the spacer material, followed by a selective anisotropic etch to remove the spacer material from horizontal surfaces, without damaging the underlying sacrificial second epitaxial semiconductor layer 702.

Figure 9:
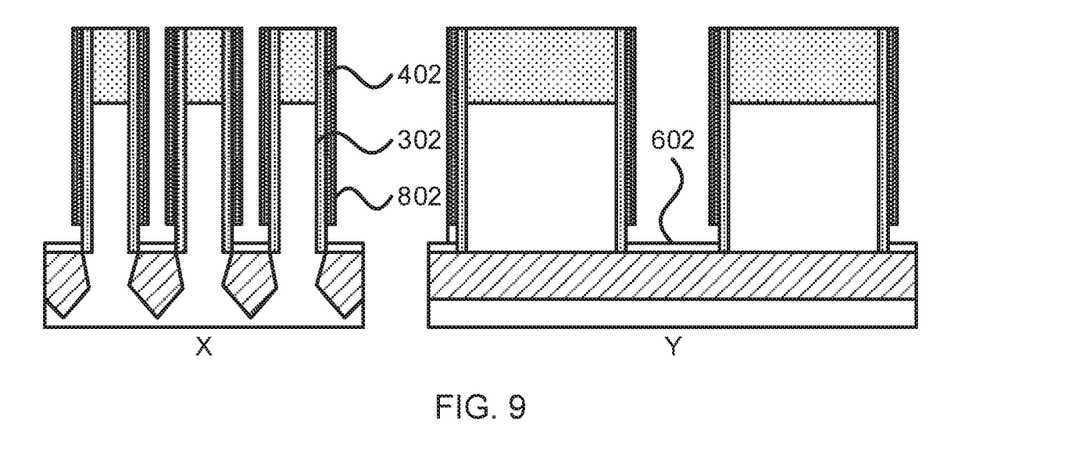
FIG. 9 is a set of cross-sectional views of a set of fins, including a plane that is perpendicular to the fins and a plane that is parallel to the fins, showing the removal of the sacrificial semiconductor layer by an isotropic etch, in accordance with an embodiment of the present invention.

Referring now to FIG. 9, cross-sectional views of a step in the fabrication of VTFETs with uniform bottom spacers is shown. The sacrificial second epitaxial semiconductor layer 702 is selectively etched away, using an isotropic etch that exposes the first epitaxial semiconductor layer 602 and a portion of the vertical outer sidewall of the liner 402, underneath the sacrificial spacers 802. This etch leaves gaps between the first epitaxial semiconductor layer 602 and the liner 402, without damaging the underlying first epitaxial semiconductor layer 602.

Figure 10:
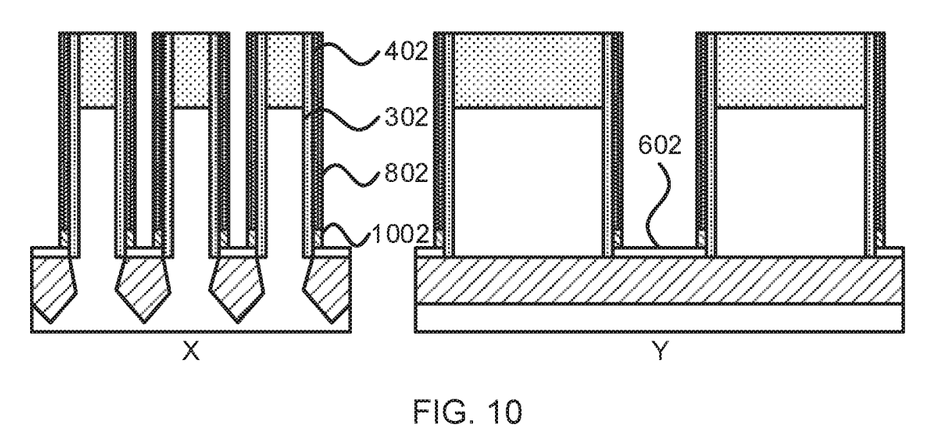
FIG. 10 is a set of cross-sectional views of a set of fins, including a plane that is perpendicular to the fins and a plane that is parallel to the fins, showing the formation of middle spacer layers in a gap left by the removal of the sacrificial semiconductor layer, in accordance with an embodiment of the present invention.

Referring now to FIG. 10, cross-sectional views of a step in the fabrication of VTFETs with uniform multi-layer bottom spacers is shown. Middle spacers 1002 are formed in the gaps left by the removal of the second epitaxial semiconductor layer 702. In some embodiments, the middle spacers 1002 can be formed by conformally depositing a layer of electrically insulating material, such as silicon dioxide for example, thereby filling the gaps between the first epitaxial semiconductor layer 602 and the liner 402. Any material outside those gaps is selectively and isotropically etched away, with material pinched-off in the gaps being sheltered from the etch by the liner 402, thereby forming the middle spacers 1002.

Figure 11:
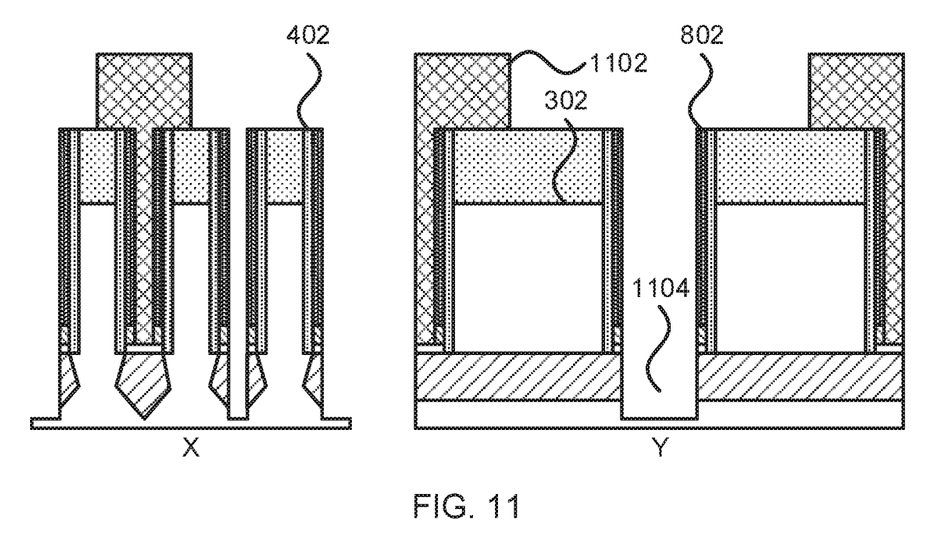
FIG. 11 is a set of cross-sectional views of a set of fins, including a plane that is perpendicular to the fins and a plane that is parallel to the fins, showing the formation of a trench between the fins, in accordance with an embodiment of the present invention.

Referring now to FIG. 11, cross-sectional views of a step in the fabrication of VTFETs with uniform multi-layer bottom spacers is shown. A mask 1102 may be formed that blocks at least some of the spaces between the fins 302 in a given cell, but leaves exposed the region between cells, and may also leave exposed at least one space between fins 302 in a given cell. The mask 1102 can be formed from any appropriate material, but it is specifically contemplated that an organic planarizing material may be used.

The organic planarizing material can include a photo-sensitive organic polymer that, when exposed to electromagnetic (EM) radiation, changes chemically to be removable by a developing solvent. Examples of photo-sensitive organic polymers may include polyacrylate resin, epoxy resin, phenol resin, polyamide resin, polyimide resin, unsaturated polyester resin, polyphenylenether resin, polyphenylenesulfide resin, or benzocyclobutene. More generally, the developable organic planarizing material may be formed from any organic polymer and a photo-active compound having a molecular structure that can attach to the molecular structure of the organic polymer. The developable organic planarizing material may, for example, be applied using spin coating technology or a flowable CVD process, followed by a photolithographic patterning process to remove material other than the mask 1102.

After the mask 1102 is formed, a selective etch is used to remove the exposed portions of the first epitaxial semiconductor layer 602 and the bottom source/drain regions 502. The etch is selective to the semiconductor material of these layers, and does not damage the regions that are protected by the mask 1102. The etch is timed to fully penetrate the bottom source/drain regions 502, thereby forming trenches 1104 in the semiconductor substrate 202 that electrically isolates the material on respective sides of the trenches 1104.

Figure 12:
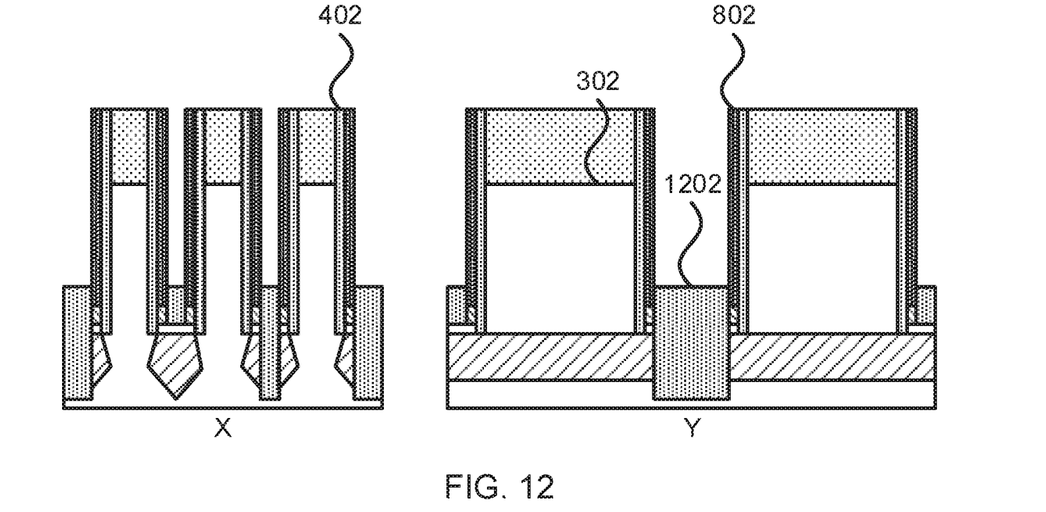
FIG. 12 is a set of cross-sectional views of a set of fins, including a plane that is perpendicular to the fins and a plane that is parallel to the fins, the formation of insulating shallow trench isolation structures in the trenches, in accordance with an embodiment of the present invention.

Referring now to FIG. 12, cross-sectional views of a step in the fabrication of VTFETs with uniform multi-layer bottom spacers is shown. The mask 1102 is removed, for example by ashing the organic planarizing material. A layer of shallow trench isolation (STI) material is filled in, for example using a flowable CVD process that may, in some embodiments, cover the fins 302. It is specifically contemplated that the STI material can be the same material as the liner 402, such as silicon dioxide. The STI material can then be etched back to a height, below the height of the fins 302, that exceeds the height of the middle spacers 1002. The additional height in the resulting STI structures 1202 helps to reduce bottom source/drain parasitic capacitance between devices on adjacent fins 302.

Figure 13:
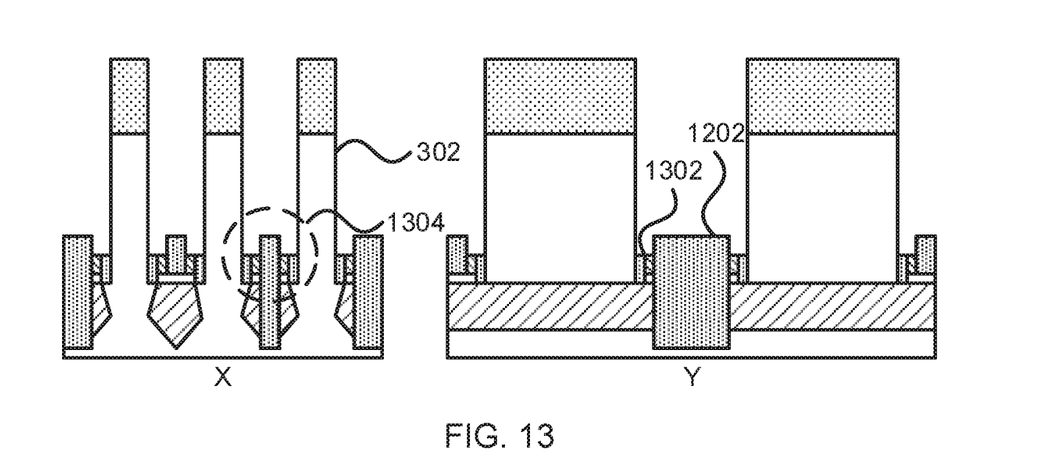
FIG. 13 is a set of cross-sectional views of a set of fins, including a plane that is perpendicular to the fins and a plane that is parallel to the fins, showing the etch back of the liners to form inner spacer layers between the middle spacer layers and the fins, in accordance with an embodiment of the present invention.

Referring now to FIG. 13, cross-sectional views of a step in the fabrication of VTFETs with uniform multi-layer bottom spacers is shown. The sacrificial spacer 802 is selectively etched away using any appropriate isotropic or anisotropic etch. The liner 402 is then etched back using a timed isotropic etch. Because the liner 402 is thin, a brief etch can be used to remove the material, with minimal damage being done to the STI structures 1202, which may be formed from the same material. Because the bottom portion of the liner 402 is protected by the middle spacer 1002, this portion of the liner 402 is protected. The etch of the liner 402 exposes the sidewalls of the fins 302. A region 1304 between the fins 302 is indicated, and is shown in greater detail below, illustrating the structure of bottom spacers 1302.

Figure 14:
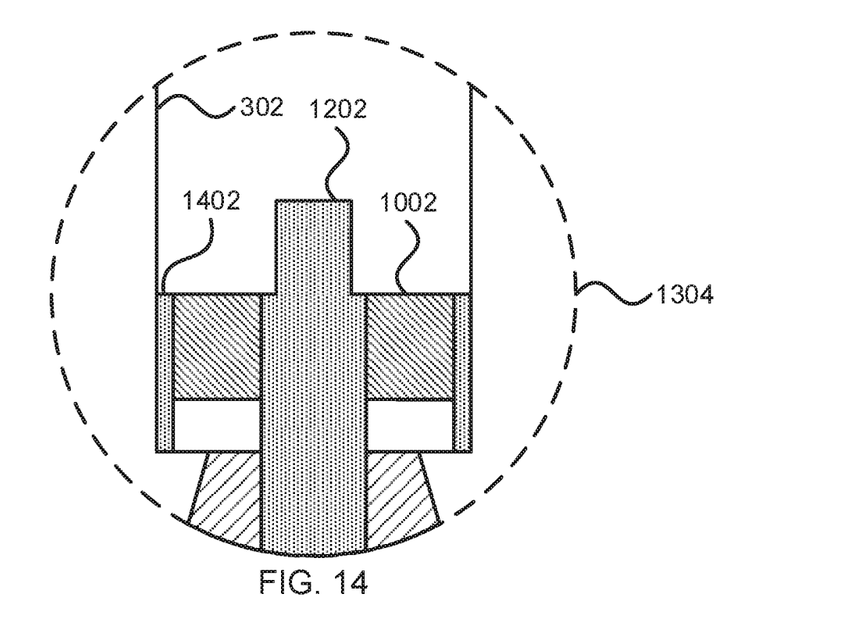
FIG. 14 is an expanded view of a region of the X cross-section of FIG. 13, showing in greater detail the three-layer structure of the bottom spacers, in accordance with an embodiment of the present invention.

Referring now to FIG. 14, additional detail is shown on the indicated region 1302 of cross-section X in FIG. 13. The etched back liner 104 becomes an inner spacer 1402. The middle spacers 1002 form a second spacer. The STI structure 1202 forms a third, outer spacer. As described herein, the first, second, and third spacers therefore refer to layers of the bottom spacers 1302 ordered in increasing distance from the fin, and particularly the inner spacer 1402, the middle spacers 1002, and the STI structure 1202, respectively.

As noted above, the first spacer 1302 can be formed from the same material as the STI structure 1202, while the middle spacers 1002 can be formed from a different material. As can be seen from the stepped profile of the STI structure 1202, some material from the STI structure 1202 is lost with the removal of the thin liner 402. Thus, the width of the top portion of the STI structure 1202 can differ from the width of the bottom portion of the STI structure 1202, by an amount that equals or exceeds the width of the first spacer 1402. Nonetheless, the remaining material of the STI structure 1202 serves to decrease the parasitic capacitance between devices on neighboring semiconductor fins 302.

Figure 15:
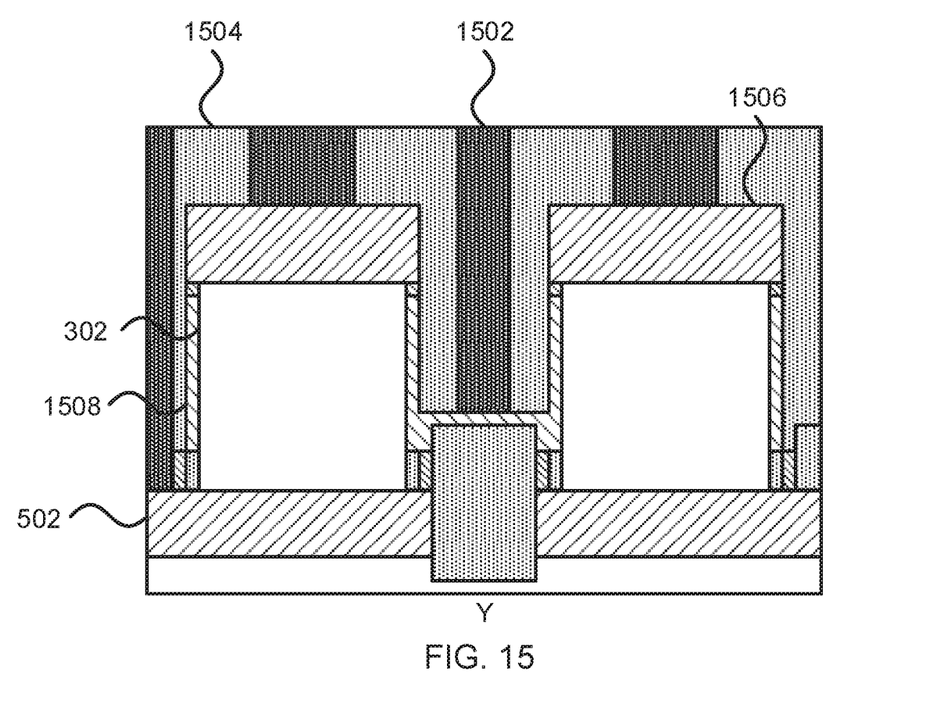
FIG. 15 is a set of cross-sectional views of a set of fins, including a plane that is perpendicular to the fins and a plane that is parallel to the fins, showing finished devices that include the three-layer bottom spacers, in accordance with an embodiment of the present invention.

Referring now to FIG. 15, a cross-sectional view of a step in the fabrication of VTFETs with uniform multi-layer bottom spacers is shown. The Y cross-section is shown enlarged to make certain features clearer. This view shows a finished device, after the formation of the bottom spacer 1302. The finished device includes, e.g., a set of conductive contacts 1502 that penetrate an interlayer dielectric 1504 to make contact with the bottom source/drain region 502, a gate stack 1508, which may include a gate conductor and a gate dielectric, and a top source/drain region 1506. The device may further include, e.g., appropriate work function metal layers, formed between the gate stack 1508 and the fins 302, to adjust the threshold voltage of the finished device. Electrical contact can then be made to the conductive contacts 1502 to operate the device as a VTFET.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C).

This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 16:
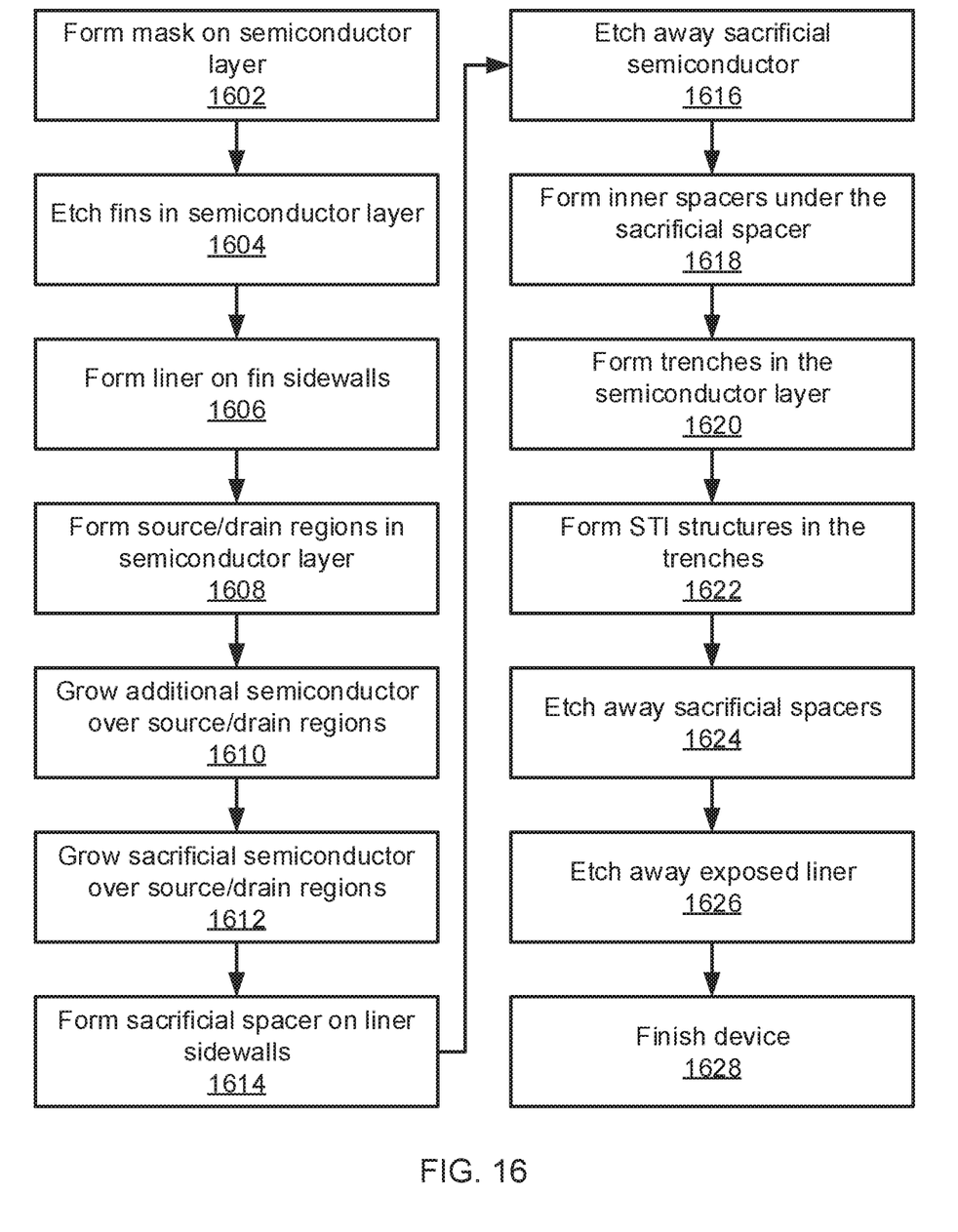
FIG. 16 is a block/flow diagram of a method of forming a semiconductor device with a self-aligned, three-layer insulating bottom spacer, in accordance with an embodiment of the present invention.

Referring now to FIG. 16, a method of forming a semiconductor device, having uniform, multi-layer bottom spacers is shown. Block 1602 forms a hardmask 204 on a semiconductor layer 202, for example using photolithography or a sidewall image transfer process. The hardmask 204 defines fin locations on the semiconductor layer 202. Block 1604 then etches down into the semiconductor layer 202, around the mask 204, using an anisotropic etch, such as an RIE. This etch forms semiconductor fins 302 from the semiconductor substrate 202.

Block 1606 forms a liner 402 on the fin sidewalls, using a conformal deposition process, followed by a selective anisotropic etch to remove the liner material from horizontal surfaces. The liner 402 can be formed from any appropriate electrically insulating material. Block 1608 then forms bottom source/drain regions 502 in the semiconductor layer 202 using, for example, ion implantation using an appropriate dopant species. The dopant species is selected to have an appropriate conductivity type, in accordance with the conductivity type of the device that is being fabricated.

Block 1610 grows a layer of additional semiconductor material 602 from the surface of the semiconductor layer 202 using, e.g., an epitaxial growth process. It is specifically contemplated that the additional semiconductor layer may be thin, between about 1nm and about 5 nm, but it should be understood that other thicknesses are also possible. Block 1612 further grows a layer of sacrificial semiconductor 702 over the layer of additional material 602. The sacrificial semiconductor 702 may be formed from a different, selectively etchable material as compared to the additional material 602, but can also be formed using an epitaxial growth process. Block 1614 then forms sacrificial spacers 802 on sidewalls of the liners 402, for example by a conformal deposition, followed by an anisotropic etch. It is contemplated that the sacrificial spacers 802 can be formed from a material that is selectively etchable with respect to the material of the additional semiconductor layer 602 and the liner 402.

Block 1616 selectively etches away the sacrificial semiconductor layer 702, using any appropriate isotropic etch, exposing a portion of the sidewalls of the liners 402 underneath the sacrificial spacers 802. Block 1618 then forms middle spacers 1002 on the exposed portion of the sidewalls of the liners 402, for example by conformally depositing an electrically insulating material, followed by a selective anisotropic etch that removes any electrically insulating material that is not protected by the sacrificial spacers 802, without harming the underlying additional semiconductor material 602.

Block 1620 forms trenches 1104 in the semiconductor layer 202, for example by forming a mask 1102 over the fins 302 and by performing a selective anisotropic etch that penetrates the bottom source/drain structures 502. The trenches 1104 electrically separate the bottom source/drain regions 502 in respective device regions from one another. Block 1622 then forms STI structures 1202 in the trenches 1104, for example depositing a dielectric material, such as silicon dioxide, and then etching back to the appropriate height. It is specifically contemplated that the height of the STI structures may exceed the height of the middle spacers 1002, to decrease parasitic capacitance between neighboring devices.

Block 1624 selectively etches away the sacrificial spacers 802, using any appropriate isotropic or anisotropic etch, thereby exposing sidewalls of the liners 402. The exposed portions of the liners 402 are selectively etched away in block 1626, leaving a bottom portion between the middle spacers 1002 and the fins 302, thereby forming inner spacer 1402. The STI structures 1202, the middle spacers 1002, and the remnants of the liner 1402 together form a bottom spacer structure 1302 that separates adjacent fins 302 from one another. Block 1628 then finished the device, for example replacing the mask 204 with an upper source/drain region, forming a gate stack 1508 around the fins 302, forming interlayer dielectric 1504, and forming electrical contacts 1502 to the various components of the device.

Having described preferred embodiments of a self-aligned uniform bottom spacers for VTFETs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
   forming a bottom source/drain structure around a fin; and
   forming a multi-layer bottom spacer on the bottom source/drain structure, around the fin, including three adjacently positioned layers, with a first layer being closest to the fin, a third layer being farthest from the fin, and a second layer being between the first layer and the third layer, the third layer having a stepped profile, with a top portion and a bottom portion, the top portion having a smaller horizontal width than a horizontal width of the bottom portion, wherein each layer of the multi-layer bottom spacer has a respective vertical height above the bottom source/drain structure, and wherein a layer of the multi-layer bottom spacer that is farthest from the fin has a greater vertical height than a layer of the multi-layer bottom spacer that is closest to the fin, to address parasitic capacitance from the bottom source/drain structure.

2. The method of claim 1, wherein the first and third layer are formed from a first dielectric material, and wherein the second layer is formed from a second dielectric material that is different from the first dielectric material.

3. The method of claim 1, wherein a difference between the width of the top portion of the third layer and the width of the bottom portion of the third layer is equal to or greater than a width of the first layer.

4. The method of claim 1, further comprising growing an additional semiconductor layer on the bottom source/drain region.

5. The method of claim 4, further comprising:
forming a dielectric liner on sidewalls of the fin, before forming the bottom source/drain region;
growing a sacrificial semiconductor layer on the additional semiconductor layer; and
forming a sacrificial spacer on the liner, after forming the sacrificial semiconductor layer.

6. The method of claim 5, further comprising etching away the sacrificial semiconductor layer after forming the sacrificial spacer, to expose a portion of the liner.

7. The method of claim 6, further comprising forming the second layer of the multi-layer bottom spacer in a gap between the sacrificial spacer and the additional semiconductor layer.

8. The method of claim 7, further comprising etching away a portion of the liner above the vertical height of the second layer of the multi-layer bottom spacer to form the first layer.

9. The method of claim 1, wherein forming the multi-layer bottom spacer comprises:
forming a trench that penetrates the bottom source/drain structure; and
forming the third layer in the trench.

10. A method for forming a semiconductor device, comprising:
forming a bottom source/drain structure around a fin;
growing an additional semiconductor layer on the bottom source/drain region; and
forming a multi-layer bottom spacer on the bottom source/drain structure, around the fin, including three adjacently positioned layers, with a first layer being closest to the fin, a third layer being farthest from the fin, and a second layer being between the first layer and the third layer, wherein each layer of the multi-layer bottom spacer has a respective vertical height above the bottom source/drain structure, and wherein a layer of the multi-layer bottom spacer that is farthest from the fin has a greater vertical height than a layer of the multi-layer bottom spacer that is closest to the fin, to address parasitic capacitance from the bottom source/drain structure.

11. The method of claim 10, wherein the first and third layer are formed from a first dielectric material, and wherein the second layer is formed from a second dielectric material that is different from the first dielectric material.

12. The method of claim 10, wherein a difference between the width of the top portion of the third layer and the width of the bottom portion of the third layer is equal to or greater than a width of the first layer.

13. The method of claim 10, further comprising:
forming a dielectric liner on sidewalls of the fin, before forming the bottom source/drain region;
growing a sacrificial semiconductor layer on the additional semiconductor layer; and
forming a sacrificial spacer on the liner, after forming the sacrificial semiconductor layer.

14. The method of claim 13, further comprising etching away the sacrificial semiconductor layer after forming the sacrificial spacer, to expose a portion of the liner.

15. The method of claim 14, further comprising forming the second layer of the multi-layer bottom spacer in a gap between the sacrificial spacer and the additional semiconductor layer.

16. The method of claim 15, further comprising etching away a portion of the liner above the vertical height of the second layer of the multi-layer bottom spacer to form the first layer.

17. The method of claim 10, wherein forming the multi-layer bottom spacer comprises:
forming a trench that penetrates the bottom source/drain structure; and
forming the third layer in the trench.

18. A method for forming a semiconductor device, comprising:
forming a bottom source/drain structure around a fin; and
forming a multi-layer bottom spacer on the bottom source/drain structure, around the fin, including three adjacently positioned layers, with a first layer being closest to the fin, a third layer being farthest from the fin, and a second layer being between the first layer and the third layer, including forming a trench that penetrates the bottom source/drain structure and forming the third layer in the trench, wherein each layer of the multi-layer bottom spacer has a respective vertical height above the bottom source/drain structure, and wherein a layer of the multi-layer bottom spacer that is farthest from the fin has a greater vertical height than a layer of the multi-layer bottom spacer that is closest to the fin, to address parasitic capacitance from the bottom source/drain structure.

* * * * *